(12) United States Patent
Neumann et al.

(10) Patent No.: US 6,181,757 B1
(45) Date of Patent: Jan. 30, 2001

(54) RETIMING METHOD AND MEANS

(75) Inventors: Roland Neumann, Holzkirchen (DE); Phil Jeffery, Tempe; David Ford, Gilbert, both of AZ (US)

(73) Assignee: Motorola Inc., Schaumburg, IL (US)

( * ) Notice: Under 35 U.S.C. 154(b), the term of this patent shall be extended for 0 days.

(21) Appl. No.: 09/067,757

(22) Filed: Apr. 27, 1998

(51) Int. Cl.[7] ...................................................... H03D 3/24
(52) U.S. Cl. ............................................................. 375/375
(58) Field of Search .................................... 375/373, 371, 375/375

(56) References Cited

U.S. PATENT DOCUMENTS

| | | | | |
|---|---|---|---|---|
| 4,672,639 | * | 6/1987 | Tanabe et al. | 375/371 |
| 5,101,203 | * | 3/1992 | Gersbach et al. | 341/100 |
| 5,185,768 | * | 2/1993 | Ferraiolo et al. | 375/373 |
| 5,815,462 | * | 9/1998 | Konishi et al. | 365/233 |

* cited by examiner

Primary Examiner—Chi H. Pham
Assistant Examiner—Kevin M Burd

(57) ABSTRACT

Retiming means for retiming an incoming data stream 2 comprising clock generation means 22 for producing a plurality of clock signals 23 having the same frequency but differing phase, and signal processing means 24 for receiving both the plurality of clock signals 23 and the incoming data stream 2 and outputting a selected one of the clock signals 23 and a retimed data stream retimed in accordance with the selected clock signal. The signal processing means 24 includes comparison means for comparing the phase of the incoming data stream with the phase of the plurality of clock signals and selecting which clock signal to use on the basis of this comparison.

1 Claim, 2 Drawing Sheets

RETIMING METHOD AND MEANS

FIELD OF THE INVENTION

The present invention relates to a retiming method and means. In particular, the present invention relates to a retiming method and means which enables instantaneous bit and therefore frame synchronisation of a received data stream.

BACKGROUND OF THE INVENTION

In order to recover data from a received serial data stream, it is necessary for the receiving apparatus to include a sampling or retiming circuit which is "bit synchronised" with the received data stream. By the term bit synchronised, it is meant that the retiming circuit is clocked in such a way that it samples the data sufficiently near the middle of each received bit to be able to correctly identify whether the bit represents a zero or a one. In order to achieve bit synchronisation, it is therefore generally necessary for the retiming circuit to be clocked at substantially the same frequency as the incoming data stream and for the phase difference between the clocking signal and the data steam to be known.

Conventionally, this has been done using a Phase-Locked-Loop circuit (PLL) using the incoming data stream as a reference clock. Once the PLL is locked to the incoming data stream, its output will be the same frequency as the data stream and will have a fixed and known phase relationship to the data stream and can therefore be used to clock the retiming circuit. However, such an arrangement suffers from the significant drawback that a finite amount of time is required to lock the PLL to the incoming data stream which in turn gives rise to a finite delay (for example of the order of a few microseconds) before data from the data stream can be successfully recovered.

This delay in achieving bit synchronisation causes problems in itself where a large number of small data transfers are to take place (as opposed to only a small number of relatively large data sets to be transferred) as is common in many modern applications. Additionally, the delay in achieving bit synchronisation generally also leads to problems in obtaining frame synchronisation because it is not easily possible to establish exactly which bit in a frame is being detected when bit synchronisation is achieved. This not only generates further undesirable delays until frame synchronisation is achieved but also necessitates the provision of specialised circuitry and/or protocol systems which generally increase the cost and complexity of data communication systems.

BRIEF DESCRIPTION OF THE DRAWINGS

In order that the present invention may be better understood, an embodiment thereof will now be described by way of example only, with reference to the accompanying drawings in which.

DETAILED DESCRIPTION OF A PREFERRED EMBODIMENT OF THE PRESENT INVENTION

Figure 1:
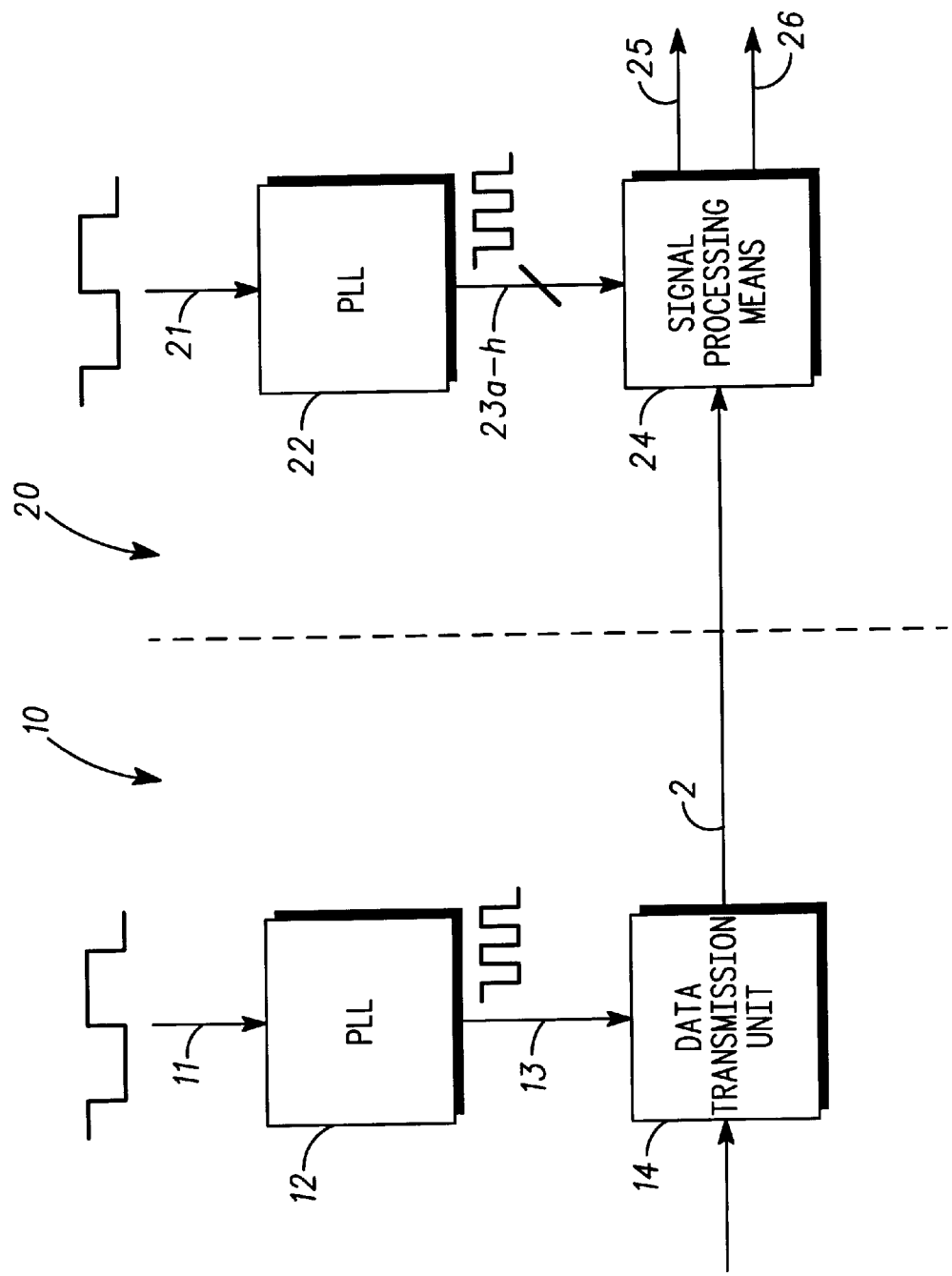
FIG. 1 is a schematic diagram of a data communication system including retiming means in accordance with the present invention.

Referring to FIG. 1, the data communication system 1 comprises a transmitting section 10 and a receiving section 20, between which a data stream 2 is communicated.

The transmitting section 10 includes a relatively accurate reference clock signal 11 having a frequency of, for example, 25 Mhz with an accuracy of about ±100 ppm (i.e. ±0.01%). The reference clock signal may be inputted to the transmitting section 10 from an external source. The reference clock signal 11 is inputted to a Phase-Locked-Loop arrangement (PLL) 12 which is arranged in a well known manner to produce a much higher frequency bit clock signal 13 having, for example, a frequency of either 1.8 or 0.9 Ghz depending upon the mode of operation of the PLL which may be determined by a user of the data communication system. This bit clock signal is used to clock a data transmission unit 14 which takes the data to be transmitted and converts it into the serial data stream 2 which is sent across a suitable communications channel (not shown) such as for example a coaxial cable. The data stream has a bit rate which is equal to the frequency of the bit clock signal 13.

The receiving section 20 similarly includes a relatively accurate reference clock signal 21 having a frequency close to, but not necessarily identical to, the frequency of the transmitting section's reference clock signal 11. Again, as in the transmitting section 10, this reference signal 21 is input to a PLL 22 which produces a plurality of much higher frequency bit clock signals 23a–23h, each having a frequency approximately equal to the frequency of the transmitting section's bit clock signal, but differing phases as discussed below. These bit clock signals 23a–23h are then used by signal processing means 24 to retime the incoming data stream in accordance with a selected clock signal of the bit clock signals 23a–23h, and to output both the retimed data stream 26 and the selected clock signal (or a clock signal corresponding thereto) 25 in a manner which is described in greater detail below. The PLL 22 together with the signal processing means 24 together constitute retiming means.

Figure 2:
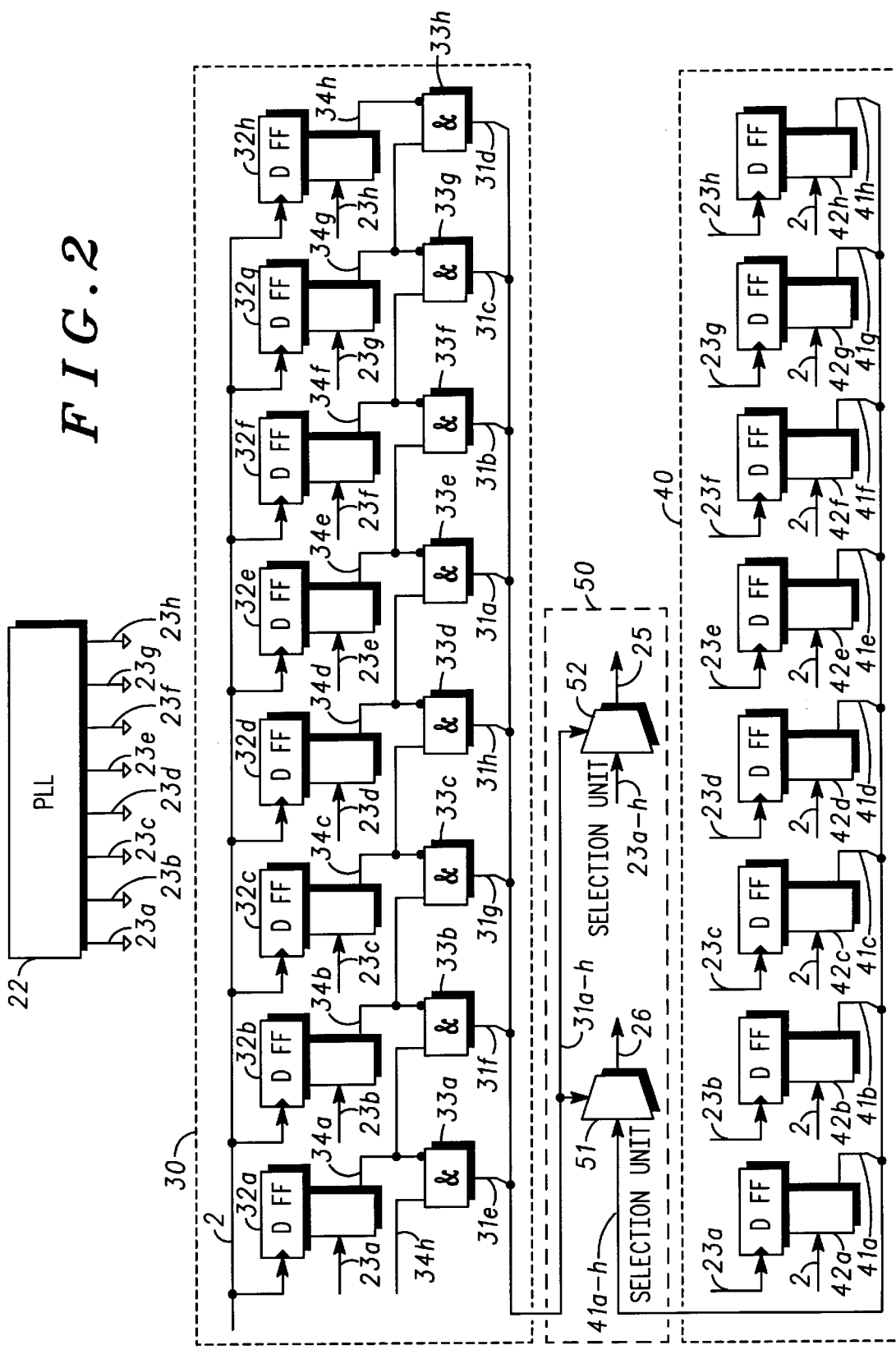
FIG. 2 is a schematic diagram of the retiming means shown in FIG. 1.

Referring now to FIG. 2, there is shown a preferred embodiment of the retiming means 22,24 of FIG. 1. The PLL 22 acts as a clock circuit which produces a bundle of clock signals 23a,23b,23c,23d,23e,23f,23g,23h all of which have the same frequency, each of which have a phase which differs by π/4 radians from its immediate neighbour. In this way an entire cycle (2π radians) of the clock signal is covered by evenly spaced (in terms of phase) clock signals. The term phase-adjacent may be used to describe a pair of clock signals whose phases are adjacent to one another. Thus in the present case all pairs of clock signals whose phases differ by only π/4 radians are phase-adjacent.

Of course, an alternative number of clock signals could be generated instead of 8, such as 6, 9, 10 etc. For example, if only 6 clock signals were generated phase-adjacent pairs of clock signals would ideally be separated by approximately π/3 radians. As mentioned above, the frequency of the clock signals 23a–23h need not be exactly the same as the bit rate of the incoming data stream 2 for reasons which will become apparent.

The signal processing means 24 includes phase detection means 30, sampling means 40 and selection means 50. Both the phase detection means 30 and the sampling means 40 receive as inputs the incoming data stream 2 and the bundle of clock signals 23. The phase detection means 30 outputs a selection signal 31a–31h which is transmitted to the selection means 50, and the sampling means 40 outputs a plurality of retimed data streams 41a–41h which are also transmitted to the selection means 50. Additionally, the selection means 50 also receives the bundle of clock signals 23a–23h as an input.

The phase detection means 30 primarily comprises a plurality of D-type flip-flops 32a–32h which are clocked by the incoming data stream 2. Each of the flip-flops 32a–32h receives, as a data input, a respective one of the clock signals 23a–23h. Clearly, when the flip-flops are clocked by a high-low transition in the data stream (which will happen at the same instant in time for all flip-flops 32a–32h), the outputs 34a–34h of the flip-flops will represent "snapshots" of the clock signals at the instant of the transition in the data stream. The clock signal which has most recently undergone a high-low transition itself, will be the one applied to a flip-flop having a low output itself, but whose preceding neighbour (which is receiving a clock signal having a slightly earlier phase) has a high output. That is to say, that in a pair of flip-flops (32b,32c) having outputs (34b,34c) which are high and low respectively, the latter flip-flop (32c) will be having applied to its data input the clock signal (23c) which most recently underwent a high-low transition after the high-low, transition in the incoming data stream clocked all the flip-flops 32a–32h.

The phase detection means 30 also comprises a plurality of logic AND gates 33a–33h. Each of the AND gates receives as input values the output values of a respective pair of consecutive flip-flops, with the latter value of each pair of flip-flops being inverted prior to being applied to the AND gate. This arrangement is such that when a pair of flip-flops (32b,32c) have outputs which are high and low respectively, the output of the AND gate to which these values are applied will go high, but will otherwise be low; a high output from an AND gate (33c) therefore indicates the flip-flop (32c) having applied to its data input the clock signal (23c) which most recently underwent a high-low transition after the high-low transition in the incoming data stream which clocked all the flip-flops 32a–32h. Clearly such a transition represents the beginning of a bit in the data stream which corresponds to the zero phase position of the incoming data stream 2 (assuming a straightforward coding system is being used in which each bit is represented by either a substantially constant high level signal or a substantially constant low level signal—c.f. Manchester coding). Thus the phase of the incoming data stream has been "detected" within an accuracy of ±½ (2π/N) radians, where N is the number of differently phased clock signals 23a–23h, flip-flops 32a–32h and AND gates 33a–33h which, in the present embodiment, is 8.

Provided the relationship is known between the bit rate of the incoming data stream, the frequency of the bundle of clock signals 23a–23h and their relative phases, it is possible to determine (at least at the instant of detection of a high-low transition in the incoming data stream) which of the bundle of clock signals 23a–23h should be used to retime the data so as to ensure that the sampling of the data stream happens as close as possible to the middle of each incoming bit. In this way, any slight drift between the bit rate of the incoming data stream 2 and the sampling rate should not lead to an incorrect sampling of the data stream. In particular, so long as the maximum possible drift is known, it is possible to ensure that a suitable transition always occurs sufficiently often that "re-centring" of the sampling inevitably happens before an error can occur.

In the present embodiment, the relationship between the bit rate of the incoming data stream 2 and the frequency of the bundle of clock signals 23a–23h is simply that they are made as nearly equal as possible. Therefore to "centre" the sampling, the retiming of the data is done in accordance with a clock signal (23g) which is substantially exactly out of phase with (i.e. having a relative phase difference of π compared with) the clock signal (23c) detected by the phase detection means, representing the beginning of a bit in the incoming data stream 2. The manner in which this is done is described below with reference to the sampling means 40 and the selection means 50.

The sampling means 40 comprises N D-type flip-flops 42a–42h all of which act as retiming elements by receiving the incoming data stream 2 at their data inputs and by being clocked by a respective one of the bundle of clock signals 23a–23h. The output of each of these flip-flops 42a–42h is therefore a data stream 41a–41h corresponding to the incoming data stream, but retimed in accordance with whichever one of the bundle of clocking signals 23a–23h is clocking the respective flip-flop. Each of these retimed data streams 41a–41h is then transmitted to the selection means 50.

The selection means 50 comprises first 51 and second 52 selection units. The selection units 51,52 are substantially identical and each has a plurality of data inputs, corresponding control inputs and an output. Any one of the data inputs can be switched into connection with the output in dependence on the value applied to the corresponding control input.

The selection units 51,52 are chosen to have at least N data and control inputs, N being equal, in the present embodiment, to 8. The outputs 31a–31h of the AND gates 33a–33h are applied to the control inputs of both selection units 51,52.

Each AND gate can be said to have an associated clock signal which is the later of the two clock signals applied to the flip-flops whose outputs are applied to the respective AND gate. As described above, each time a high-low transition occurs in the incoming data stream all of the flip-flops 32a–32h will be clocked and the output (31g) of one (33c) of the AND gates 33a–33h will go high while the others go low, and it is known (for the reasons described above) that the associated clock signal (23c) of the AND gate (33c) whose output (31g) goes high is substantially "in phase" with the incoming data. Therefore, as described above, in order to "centre" the sampling, the output signals 31e–31h,31a–31d of the AND gates 33a–33h are connected to the selection units 51,52 so as to select a clock signal 23e–23h,23a–23d, or a data stream 41e–41h,41a–41d retimed in accordance with a clock signal, which is substantially out of phase with the associated clock signals 23a–23h.

In this way, the retiming means 22,24 is able to obtain bit synchronisation with the incoming data stream as soon as a high-low transition occurs in the data stream. It is, of course, an easy matter to ensure that each frame of data transmitted in the data stream 2 commences with a high-low transition and thus to ensure instantaneous bit and frame synchronisation.

It will be appreciated by persons skilled in the art that the above described embodiment represents only one way of carrying out the invention, and that many of the particular arrangements described above could be modified or replaced without affecting the essential operation of the invention whose scope is to be determined in accordance with the accompanying claims. In particular, although the above described embodiment has a bundle of 8 differently phased clock signals 23a–23h, in certain circumstances it may be desirable to use either more or less clock signals. Furthermore, alternative electronic arrangements will be apparent to persons skilled in the art which are able to perform the same functions as signal processing means 24, phase detection means 30, sampling means 40 and selection means 50. In particular, although the above described embodiment is clocked by a high-low transition in the received data stream, it will be apparent that there is no substantive reason why it should not alternatively or additionally be clocked by a low-high transition with suitable modifications to the circuitry.

What is claimed is:

1. Retiming means for retiming an incoming data stream, the retiming means comprising:

a clock circuit adapted to produce a plurality of clock signals having the same frequency but differing phases, wherein said same frequency is substantially equal to the frequency of the incoming data stream; and signal processing means for receiving both the incoming data stream and the plurality of clock signals and for outputting a retimed data signal corresponding to the incoming data stream retimed in accordance with a selected one of the plurality of clock signals, wherein the signal processing means comprises:

a first plurality of flip-flops each having a clock input for receiving the incoming data stream and a data input for receiving a respective clock signal of the plurality of clock signals, and an output;

a plurality of logic circuits each having a pair of inputs coupled to outputs of respective pairs of flip-flops of the first plurality of flip-flops, and an output;

a first selection circuit coupled to the outputs of the plurality of logic circuits and to the plurality of clock signals and providing the selected one of the plurality of clock signals;

a second plurality of flip-flops each having a data input for receiving the incoming data stream and a clock input for receiving a respective clock signal of the plurality of clock signals, and an output; and a second selection circuit coupled to the outputs of the second plurality of flip-flops and to the outputs of the plurality of logic circuit and providing the retimed data signal.

* * * * *